(12) United States Patent
Hsu et al.

(10) Patent No.: US 11,257,547 B2
(45) Date of Patent: Feb. 22, 2022

(54) OPERATION METHOD FOR MEMORY DEVICE

(71) Applicant: MACRONIX INTERNATIONAL CO., LTD., Hsinchu (TW)

(72) Inventors: Tzu-Hsuan Hsu, Chiayi County (TW); Po-Kai Hsu, Tainan (TW); Teng-Hao Yeh, Zhubei (TW); Hang-Ting Lue, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 17/105,669

(22) Filed: Nov. 27, 2020

(65) Prior Publication Data

US 2022/0013180 A1 Jan. 13, 2022

Related U.S. Application Data

(60) Provisional application No. 63/048,662, filed on Jul. 7, 2020.

(51) Int. Cl.
| | | |
|---|---|---|
| *G11C 11/34* | (2006.01) | |
| *G11C 16/26* | (2006.01) | |
| *G11C 16/14* | (2006.01) | |
| *G06N 3/04* | (2006.01) | |
| *G11C 11/56* | (2006.01) | |

(52) U.S. Cl.
CPC .............. *G11C 16/26* (2013.01); *G11C 16/14* (2013.01); *G06N 3/04* (2013.01); *G11C 11/5621* (2013.01); *G11C 11/5671* (2013.01)

(58) Field of Classification Search
CPC ............ G11C 16/3454; G11C 16/3459; G11C 11/5628; G11C 16/0483; G11C 221/5621
USPC ........................................ 365/185.22, 185.24
See application file for complete search history.

(56) References Cited

U.S. PATENT DOCUMENTS

| | | | |
|---|---|---|---|
| 9,082,510 B2* | 7/2015 | He | G11C 11/5628 |
| 2015/0070986 A1* | 3/2015 | Hirai | G11C 16/3427 |
| | | | 365/185.03 |

* cited by examiner

*Primary Examiner* — Son T Dinh
(74) *Attorney, Agent, or Firm* — McClure, Qualey & Rodack, LLP

(57) ABSTRACT

Provided is an operation method for a memory device, the operation method comprising: performing an erase operation; performing a verify-read operation on a memory cell to generate a cell current, the memory cell including a first transistor and a second transistor; checking whether the cell current is lower than a first cell current threshold; when the cell current is not lower than the first cell current threshold, increasing a memory gate voltage until the cell current is lower than the first cell current threshold, wherein the memory gate voltage is applied to the first transistor; fixing the memory gate voltage and increasing a drain voltage; checking whether the cell current is lower than a second cell current threshold; and if the cell current is not lower than the second cell current threshold, increasing the drain voltage until the cell current is lower than the second cell current threshold.

14 Claims, 6 Drawing Sheets

OPERATION METHOD FOR MEMORY DEVICE

This application claims the benefit of U.S. provisional application Ser. No. 63/048,662, filed Jul. 7, 2020, the subject matter of which is incorporated herein by reference.

TECHNICAL FIELD

The disclosure relates in general to an operation method for a memory device.

BACKGROUND

Deep neural networks (DNNs) have achieved successes in several application fields such as image recognition, speech recognition, etc. Recently, computing in memory (CIM) has got great attention as a potential low-power solution to realize efficient computing for the deep neural network. Since CIM may reduce data movement, CIM directly utilizes memory arrays as the computing units to accelerate the DNN calculation and to reduce the system power consumption.

To increase the CIM capacity and cost-per-bit reduction, multi-bit data storage is developed. Therefore, tighten current distribution for MLCs is essential to improve recognition accuracy of DNN system.

SUMMARY

According to one embodiment, provided is an operation method for a memory device, the operation method comprising: performing an erase operation; performing a verify-read operation on a memory cell to generate a cell current, the memory cell including a first transistor and a second transistor; checking whether the cell current is lower than a first cell current threshold; when the cell current is not lower than the first cell current threshold, increasing a memory gate voltage until the cell current is lower than the first cell current threshold, wherein the memory gate voltage is applied to the first transistor; fixing the memory gate voltage and increasing a drain voltage; checking whether the cell current is lower than a second cell current threshold; and if the cell current is not lower than the second cell current threshold, increasing the drain voltage until the cell current is lower than the second cell current threshold.

According to another embodiment, provided is an operation method for a memory device, the operation method comprising: performing an erase operation; performing a verify-read operation on a memory cell to generate a cell current, the memory cell including a first transistor and a second transistor; checking whether the cell current is lower than a first cell current threshold; when the cell current is not lower than the first cell current threshold, fixing a memory gate voltage and increasing a drain voltage until the cell current is lower than the first cell current threshold, wherein the memory gate voltage is applied to the first transistor; checking whether the cell current is lower than a second cell current threshold; and when the cell current is not lower than the second cell current threshold, increasing the memory gate voltage until the cell current is lower than the second cell current threshold.

Figure 1:
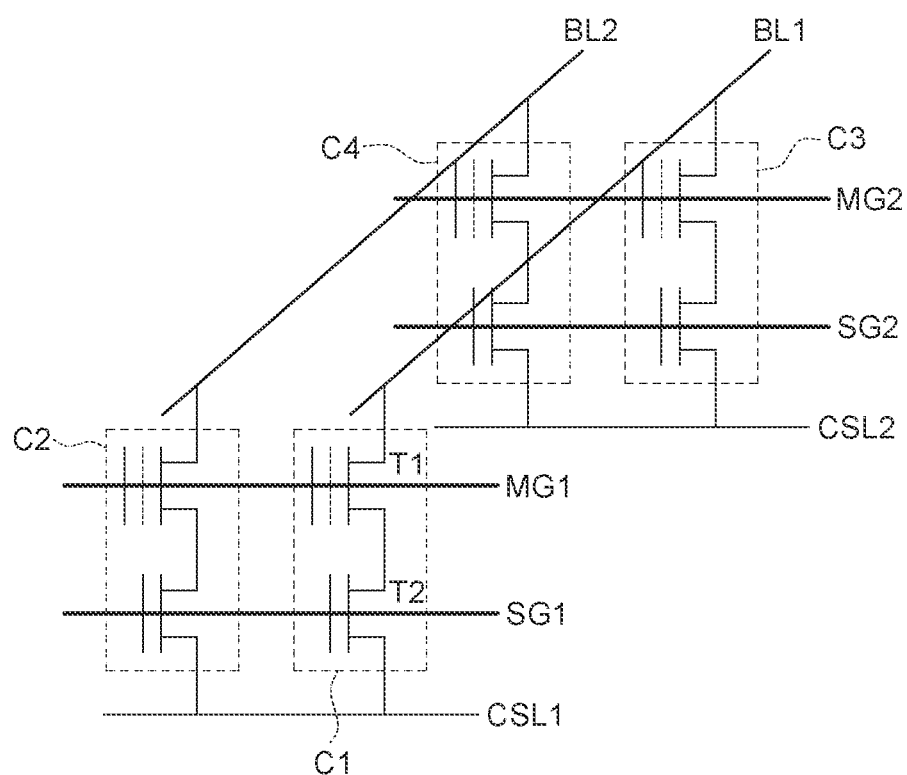
FIG. 1 shows a circuit structure for a memory cell of a memory device according to one embodiment of the application.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DESCRIPTION OF THE EMBODIMENTS

Technical terms of the disclosure are based on general definition in the technical field of the disclosure. If the disclosure describes or explains one or some terms, definition of the terms is based on the description or explanation of the disclosure. Each of the disclosed embodiments has one or more technical features. In possible implementation, one skilled person in the art would selectively implement part or all technical features of any embodiment of the disclosure or selectively combine part or all technical features of the embodiments of the disclosure.

FIG. 1 shows a circuit structure for a memory cell of a memory device according to one embodiment of the application. The memory device includes a plurality of memory cells. FIG. 1 shows four memory cells C1-C4, but the application is not limited thereby. Each of the memory cells includes two series-connected transistors. For example, the memory cell C1 includes two series-connected transistors T1 and T2. The transistor T1 includes: a first terminal coupled to the bit line BL1, a control terminal (or said, a memory gate) coupled to the memory gate line MG1 and a second terminal coupled to the transistor T2. The transistor T2 includes: a first terminal coupled to the transistor T1, a control terminal (or said, a select gate) coupled to the select gate line SG1 and a second terminal coupled to the column select line CSL1. BL1 and BL2 are bit lines. MG1 and MG2 are memory gate lines. SG1 and SG2 are select gate lines. CSL1 and CSL2 are column select lines. The transistor T2 is a MOS transistor. In the following, the voltage applied on the memory gate lines MG1 and MG2 are referred as the memory gate voltage V_MG; the voltage applied on the select gate lines SG1 and SG2 are referred as the select gate voltage V_SG; and the voltage applied on the bit lines BL1 and BL2 are referred as the bit line voltage V_BL (or called a drain voltage). The memory gate voltage V_MG determines the storage state of the transistor T1 (i.e. determines the storage state of the memory cell C1); and the select gate voltage V_SG determines the current of the transistor T2 (i.e. determines the cell current Id of the memory cell C1). In other possible embodiment of the application, the control terminal of the transistor T1 and the control terminal of the transistor T2 may be both the memory gates, which is still within the spirit and scope of the application.

The interlayer of the transistor T1 is for example but not limited by a charge storage layer. The charge storage layer is for example but not limited by, a floating gate or a charge trapping structure or high k material. The charge trapping structure is for example but not limited by, a SONOS (Silicon-Oxide-Nitride-Oxide-Silicon) layer or a BESONOS (Band-gap Engineered Silicon Oxide Nitride Oxide Silicon) layer.

Figure 2:
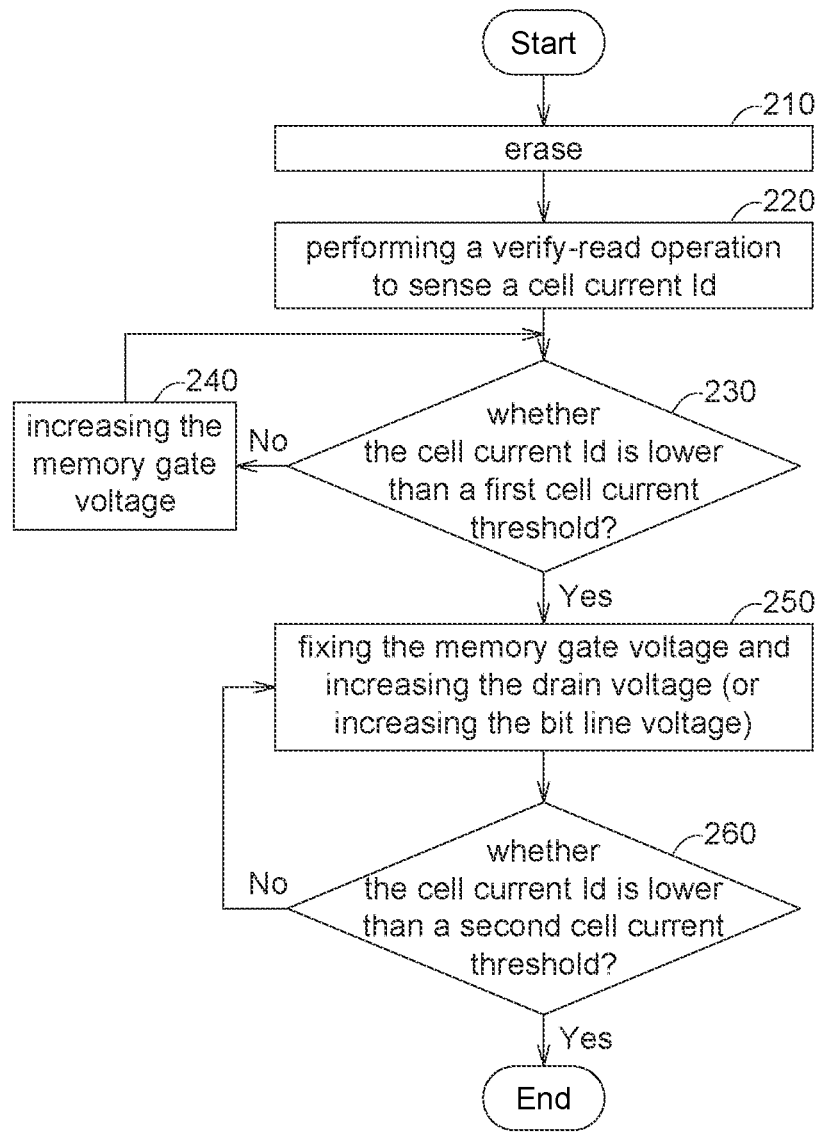
FIG. 2 shows a flow chart of an operation method for a memory device according to one embodiment of the application.

FIG. 2 shows a flow chart of an operation method for a memory device according to one embodiment of the application, which is used for programming the memory device. As shown in FIG. 2, in step 210, an erase operation is performed to reduce the threshold voltage and to raise the cell current. In step 220, a verify-read operation is performed on at least one memory cell to sense (generate) at least one cell current Id. In step 230, it is checked whether the cell current Id is lower than a first cell current threshold. In here, for example but not limited by, the first cell current threshold is set as a value between TCC*200% and TCC*130%, wherein TCC refers to a target cell current. If no in step 230, then the flow proceeds to step 240. In step 240, the memory gate voltage V_MG is increased until the cell current Id is lower than the first cell current threshold (also referred as a pre-verify current level). When the step 230 is yes (i.e. when the cell current Id is lower than the first cell current threshold), the flow proceeds to step 250. In step 250, the memory gate voltage V_MG is fixed but the drain voltage is increased (or said, the bit line voltage is increased). In step 260, it is checked whether the cell current Id is lower than a second cell current threshold. In here, for example but not limited by, the second cell current threshold is set as a value between TCC*130% and TCC*110%, wherein TCC refers to the target cell current. If step 260 is no, then the flow returns to step 250 to increase the drain voltage (or said, to increase the bit line voltage) until the cell current Id is lower than the second cell current threshold. When the cell current Id is lower than the second cell current threshold, the operation method in FIG. 2 is completed. The first cell current threshold is higher than the second cell current threshold.

In one embodiment of the application, adjustment of the gate voltage applied to the select gate of the second transistor is based on the voltage level required by the operations on the first transistor.

The operation method for the memory device may be considered as to program the memory device in two stages. In the first stage, the memory gate voltage V_MG is increased to rapidly decrease the cell current. Thus, the first stage is a coarse programming stage. In the second stage, the bit lint voltage is increased to lower the cell current. Thus, the second stage is a fine programming stage.

However, in other possible embodiment of the application, in a first stage the bit line voltage is increased to decrease the cell current. In a second state, the memory gate voltage V_MG is increased to rapid decrease the cell current. This is still within the spirit and the scope of the application. Other possible embodiment of the application discloses an operation method for a memory device, the operation method comprising: performing an erase operation; performing a verify-read operation on a memory cell to generate a cell current, the memory cell including a first transistor and a second transistor, checking whether the cell current is lower than a first cell current threshold; when the cell current is not lower than the first cell current threshold, fixing a memory gate voltage and increasing a drain voltage until the cell current is lower than the first cell current threshold, wherein the memory gate voltage is applied to the first transistor; checking whether the cell current is lower than a second cell current threshold; and when the cell current is not lower than the second cell current threshold, increasing the memory gate voltage until the cell current is lower than the second cell current threshold.

Figure 3:
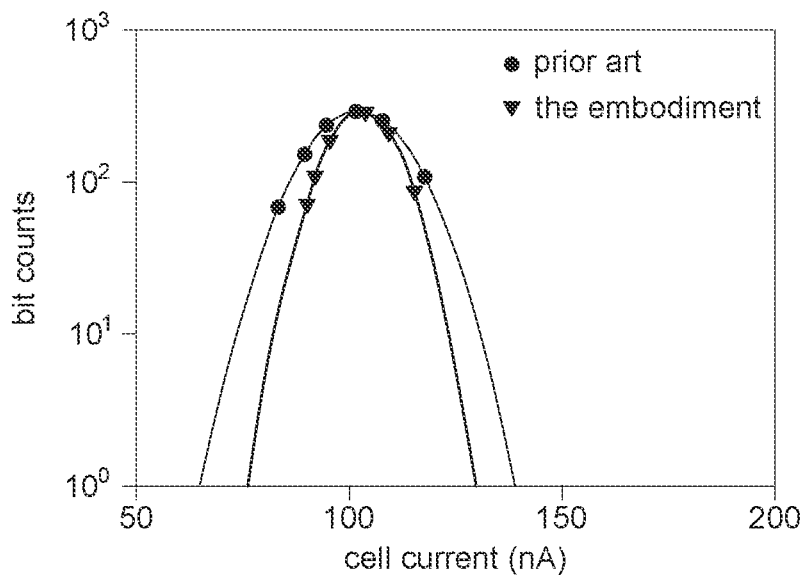
FIG. 3 shows relationship diagram between the cell current and the bit counts in the prior art and in one embodiment of the application, respectively.

FIG. 3 shows relationship diagram between the cell current and the bit counts in the prior art and in one embodiment of the application, respectively. As seen from the relationship diagram between the cell current and the bit counts in the prior art, the cell current distribution in the prior art is wide, wherein when the cell current peak is 102 nA, the cell current sigma ($\sigma$) is about 12 nA. By comparison, as seen from the relationship diagram between the cell current and the bit counts in one embodiment of the application, the cell current distribution in one embodiment of the application is narrow, wherein when the cell current peak is 103 nA, the cell current sigma ($\sigma$) is about 8 nA. Thus, from FIG. 3, one embodiment of the application has advantage of narrow cell current distribution.

Figure 4:
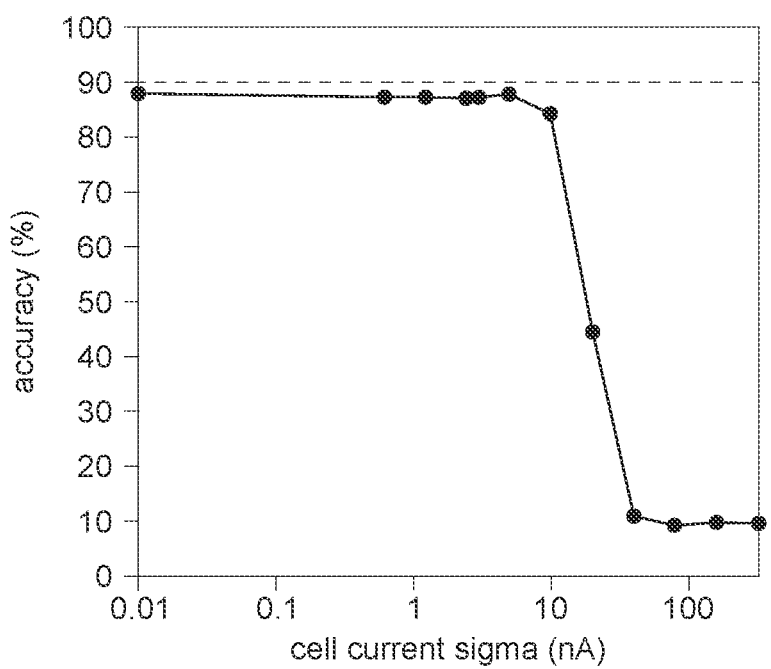
FIG. 4 shows relationship diagram between the cell current sigma and the AI accuracy.

FIG. 4 shows relationship diagram between the cell current sigma and the AI (artificial intelligence) accuracy. Referring to FIG. 3 and FIG. 4. The cell current sigma ($\sigma$) in the prior art is about 12 nA and thus the AI accuracy in the prior art is about 70%. The cell current sigma ($\sigma$) in one embodiment of the application is about 8 nA and thus the AI accuracy in one embodiment of the application is about 90%. Thus, as shown in FIG. 4, one embodiment of the application has advantage of improving AI accuracy.

Figure 5A:
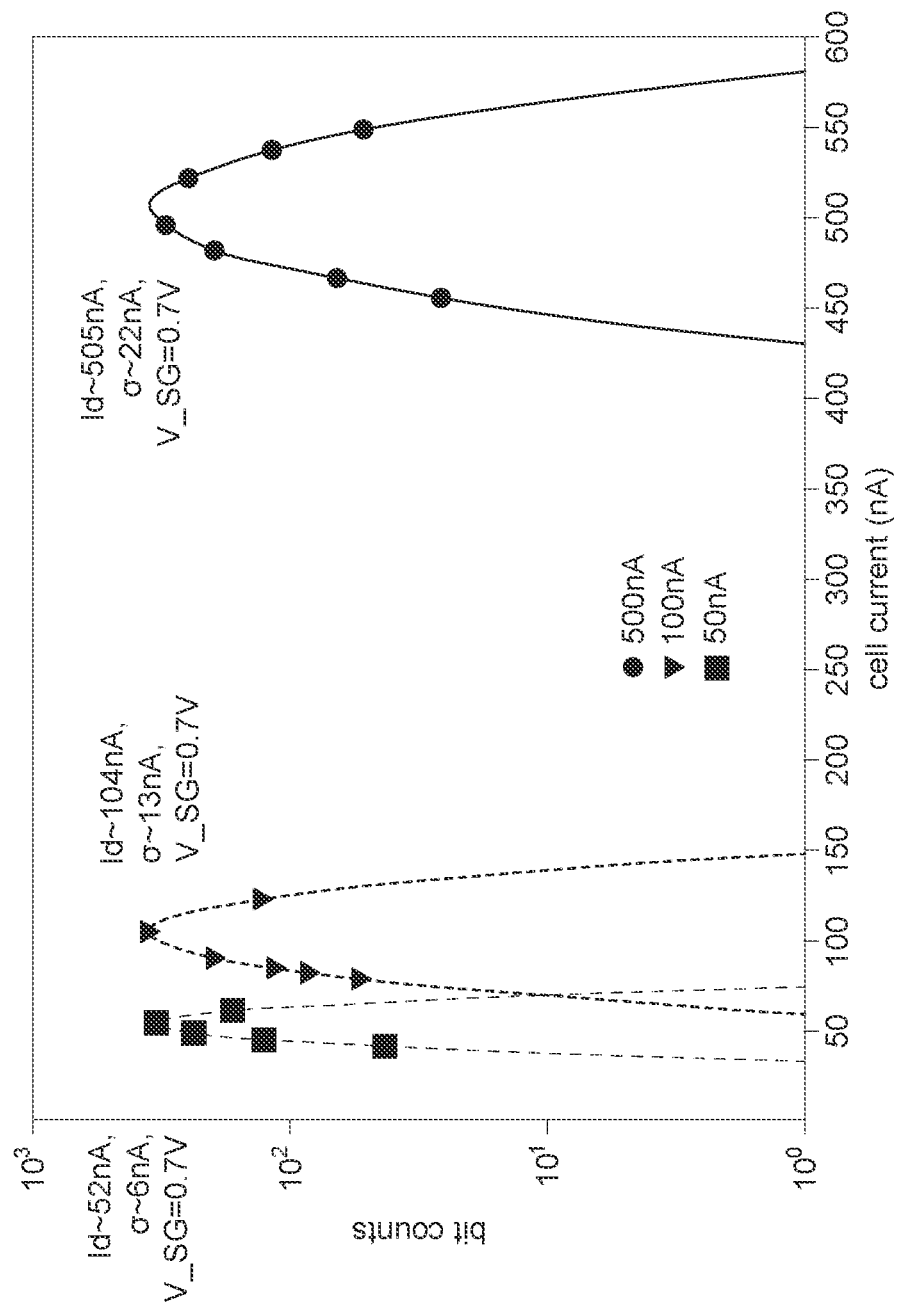
FIG. 5A (prior art) shows relationship diagram between the cell current and the bit counts in the prior art.

FIG. 5A shows relationship diagram between the cell current and the bit counts in the prior art, wherein the memory cell is a multi-bit memory cell. That is, when used in MAC (multiplication and addition) operations, the multi-bit memory cell is to be written several weight values. In reading the memory cells in the prior art, the select gate voltage is set about 0.7V.

Figure 5B:
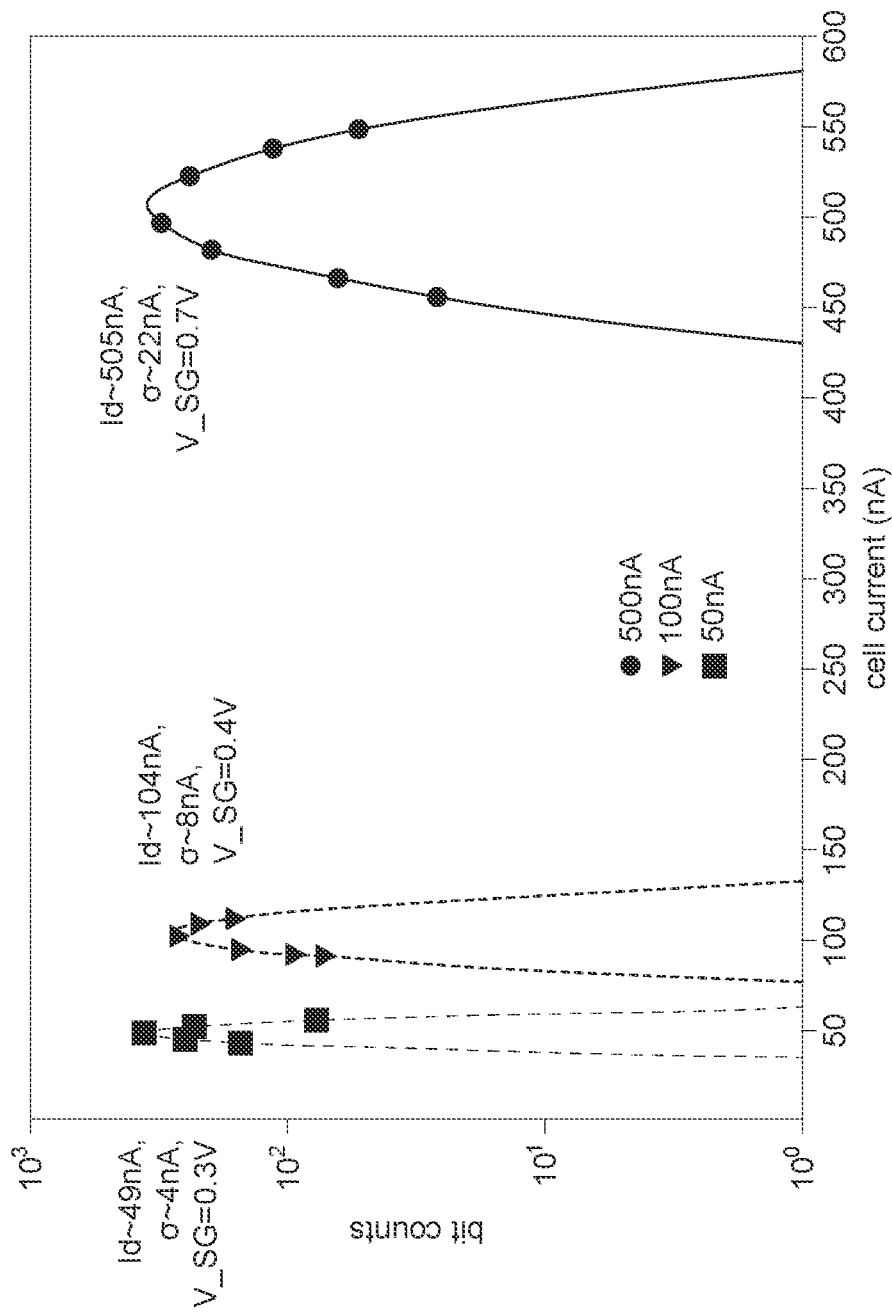
FIG. 5B shows relationship diagram between the cell current and the bit counts in one embodiment of the application.

FIG. 5B shows relationship diagram between the cell current and the bit counts in one embodiment of the application, wherein the memory cell is a multi-bit memory cell. In reading the memory cells in one embodiment of the application, when the target cell current is about 50 nA, the select gate voltage V_SG is determined or adjusted as 0.3V; when the target cell current is about 100 nA, the select gate voltage V_SG is determined or adjusted as 0.4V; and when the target cell current is about 500 nA, the select gate voltage V_-SG is determined or adjusted as 0.7V.

Figure 6:
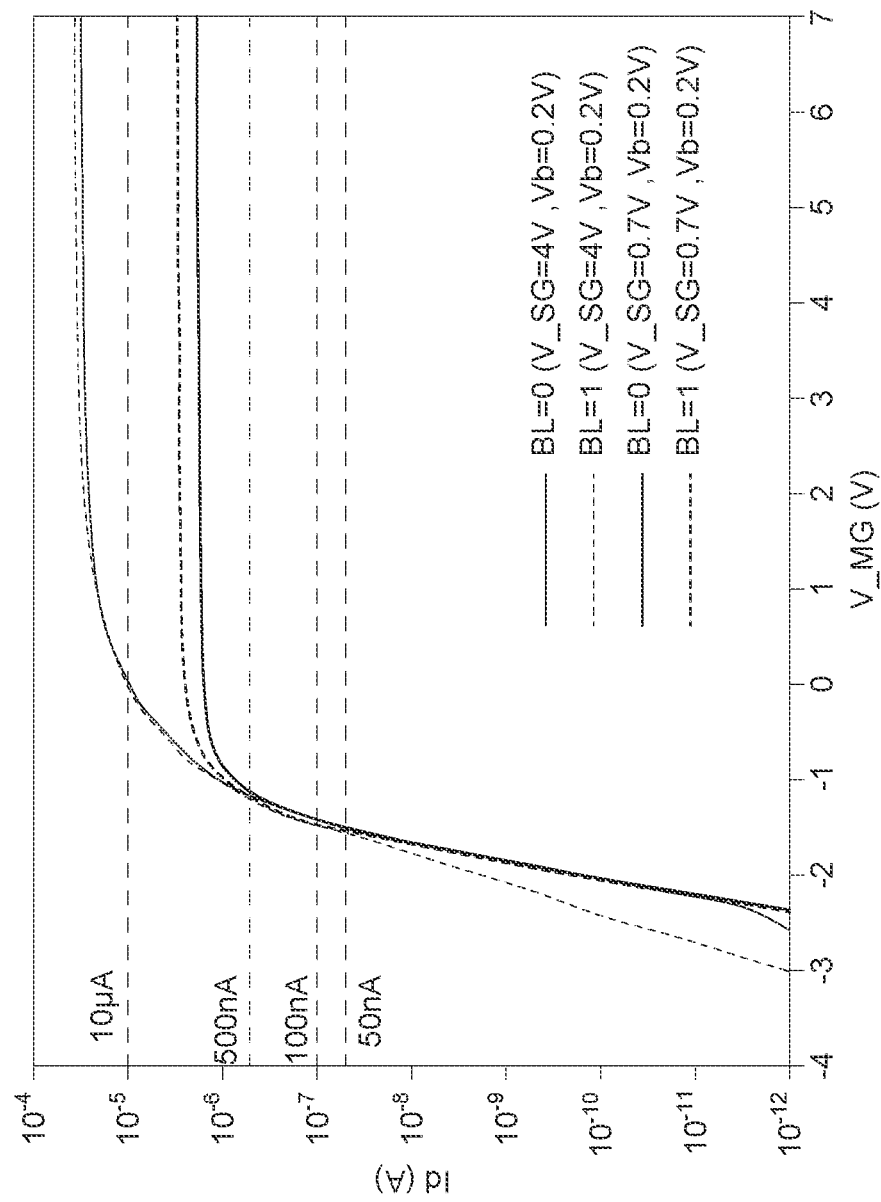
FIG. 6 shows applying different select gate voltages to adjust a saturation current during read operations according to one embodiment of the application.

FIG. 6 shows applying different select gate voltages (V_SG) to adjust a saturation current during read operations according to one embodiment of the application. As shown in FIG. 6, in one embodiment of the application, during read operations, the drain read voltage is fixed (Vb=0.2V), and different select gate voltages (V_SG=4V or 0.7V) are applied to provide the required current level (that is, to meet the required Vt distribution of MLC).

In one embodiment of the application, during read operations, by adjusting the select gate voltage V_SG, the memory cells may be operated in the saturation region, rather in the sub-threshold region. Thus, the memory cells have small current fluctuation for CIM application.

The embodiment of the application is suitable for 2T (or multi-T) NOR or 2 T (or multi-T) AND flash artificial intelligence accelerator, or suitable for 2T (or multi-T) NOR or 2 T (or multi-T) AND flash MAC (multiplication and addition) accelerator.

The embodiment of the application is suitable for 2 T (or multi-T) NOR or 2 T (or multi-T) AND stand-alone or embedded nonvolatile memory devices.

One embodiment of the application applies asymmetrical SSI (source side injection) programming to tighten the cell current distribution. Further, in reading, the select gate voltage is adjusted to operate the memory cells in the saturation region and thus the memory cells have small current fluctuation for CIM application.

One embodiment of the application is suitable for planar or vertical 3D nonvolatile memories with 2T or multi-transistors as storage unit.

One embodiment of the application provides an operation method for CIM of planar or vertical 3D nonvolatile memories with 2T or multi-transistors. By using two step programming, in reading, the select gate voltage is adjusted and thus the saturation region has different current level. This is advantageous in tightening the cell current distribution and improving DNN accuracy. Still further, in one embodiment of the application, in two step programming, the memory gate voltage is stepping adjusted to adjust the memory cell current to reach the pre-verify current level (i.e. the first cell current threshold). Then, by increasing the bit line voltage (or increasing the drain voltage), the target memory cell current is reached.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An operation method for a memory device, the operation method comprising:
    performing an erase operation;
    performing a verify-read operation on a memory cell to generate a cell current, the memory cell including a first transistor and a second transistor;
    checking whether the cell current is lower than a first cell current threshold;
    when the cell current is not lower than the first cell current threshold, increasing a memory gate voltage until the cell current is lower than the first cell current threshold, wherein the memory gate voltage is applied to the first transistor;
    fixing the memory gate voltage and increasing a drain voltage;
    checking whether the cell current is lower than a second cell current threshold; and
    when the cell current is not lower than the second cell current threshold, increasing the drain voltage until the cell current is lower than the second cell current threshold.

2. The operation method according to claim 1, wherein the first cell current threshold is higher than the second cell current threshold.

3. The operation method according to claim 1, wherein the first cell current threshold is set as a value between TCC*200% and TCC*130%, TCC referring a target cell current.

4. The operation method according to claim 1, wherein the second cell current threshold is set as a value between TCC*130% and TCC*110%, TCC referring a target cell current.

5. The operation method according to claim 1, wherein in reading, a select gate voltage applied to the second transistor is adjusted based on the cell current.

6. The operation method according to claim 1, wherein the first transistor and the second transistor is series-connected.

7. The operation method according to claim 1, wherein an interlayer of the transistor is a charge storage layer; and the second transistor is a MOS transistor.

8. An operation method for a memory device, the operation method comprising:
    performing an erase operation;
    performing a verify-read operation on a memory cell to generate a cell current, the memory cell including a first transistor and a second transistor;
    checking whether the cell current is lower than a first cell current threshold;
    when the cell current is not lower than the first cell current threshold, fixing a memory gate voltage and increasing a drain voltage until the cell current is lower than the first cell current threshold, wherein the memory gate voltage is applied to the first transistor;
    checking whether the cell current is lower than a second cell current threshold; and
    when the cell current is not lower than the second cell current threshold, increasing the memory gate voltage until the cell current is lower than the second cell current threshold.

9. The operation method according to claim 8, wherein the first cell current threshold is higher than the second cell current threshold.

10. The operation method according to claim 8, wherein the first cell current threshold is set as a value between TCC*200% and TCC*130%, TCC referring a target cell current.

11. The operation method according to claim 8, wherein the second cell current threshold is set as a value between TCC*130% and TCC*110%, TCC referring a target cell current.

12. The operation method according to claim 8, wherein in reading, a select gate voltage applied to the second transistor is adjusted based on the cell current.

13. The operation method according to claim 8, wherein the first transistor and the second transistor is series-connected.

14. The operation method according to claim 8, wherein an interlayer of the transistor is a charge storage layer; and the second transistor is a MOS transistor.

* * * * *